(12) United States Patent  
Musk

(10) Patent No.: US 6,894,314 B2
(45) Date of Patent: May 17, 2005

(54) OPTICAL POWER MONITORING FOR A SEMICONDUCTOR LASER DEVICE

(76) Inventor: Robert William Musk, 2 Overlangs, Kingston, Kingsbridge, Devon (GB), TQ7 4PF (*) Notice: Subject to any disclaimer, the term of this patent is extended or adjusted under 35 U.S.C. 154(b) by 0 days.

(21) Appl. No.: 10/775,910

(22) Filed: Feb. 10, 2004

(65) Prior Publication Data
US 2004/0222439 A1 Nov. 11, 2004

Related U.S. Application Data
(60) Provisional application No. 60/446,126, filed on Feb. 10, 2003.

(51) Int. Cl.[7] .......................... H01L 27/15; H01L 31/12; H01L 33/00
(52) U.S. Cl. .................. 257/80; 257/82; 372/29.014
(58) Field of Search ................. 257/80, 82; 372/29.014

(56) References Cited

U.S. PATENT DOCUMENTS 5,675,597 A * 10/1997 Shigihara .................... 372/109
5,761,178 A * 6/1998 Fukakusa et al. ......... 369/112.27
6,535,538 B1 * 3/2003 Lee et al. ..................... 372/50

* cited by examiner

Primary Examiner—David Nelms
Assistant Examiner—Tu-Tu Ho
(74) Attorney, Agent, or Firm—Parsons & Goltry; Robert A. Parsons; Michael W. Goltry

(57) ABSTRACT

A power monitoring arrangement for semiconductor light emitting devices used in optoelectronic packages includes a mounting structure, a light emitting device, and a monitor photodetector. The mounting structure has a mounting surface with the light emitting device and the monitor photodetector positioned thereon. The light emitting device provides emitted light at a monitoring output and an active output. The monitor photodetector has a light sensitive region and is positioned on the mounting surface of the mounting structure proximate the monitoring output of the light emitting device. A hemisphere of material is formed to include at least the light sensitive region of the monitor photodetector and the monitoring output of the light emitting device. An outer surface of the hemisphere operates as a reflecting surface to reflect light from the monitoring output of the light emitting device to the light sensitive region of the monitor photodetector.

11 Claims, 2 Drawing Sheets

OPTICAL POWER MONITORING FOR A SEMICONDUCTOR LASER DEVICE

CROSS-REFERENCE TO RELATED APPLICATIONS

This application claims the benefit of U.S. Provisional Application No. 60/446,126, filed 10 Feb. 2003.

FIELD OF THE INVENTION

This invention relates to optoelectronic packages and, more particularly, to monitoring the optical output power of a semiconductor laser device typically used in such packages.

BACKGROUND OF THE INVENTION

Optoelectronic packaging solutions for light emitting devices are designed to allow efficient coupling of the light emitting device with an optical system. The light emitting device is driven by control circuitry which may or may not be housed in the optoelectronic package with the light emitting device. However, a compact package with a high optical coupling efficiency is still desirable. The package must also provide adequate thermal dissipation of the heat generated by the light emitting device and associated circuitry.

In addition, it is also desirable to monitor the optical power of the light emitting device, generally to ensure a constant output from individual devices and to ensure a standard output between similar devices. Optical power monitoring is often done by placing a photodetector device proximate to the light emitting device. However, the placement of the photodetector device introduces numerous design constraints to the overall optoelectronic package. For example, it is desirable to make the optoelectronic package as compact as possible. It is also desirable to provide accurate optical power monitoring which is not substantially susceptible to alignment variations between the light emitting device and the photodetector. Critical alignment or placement requirements can substantially increase the labor, time, and cost of manufacturing the optoelectronic packages.

It would be highly advantageous, therefore, to remedy the foregoing and other deficiencies inherent in the prior art.

An object of the present invention is to provide a new and improved power monitoring arrangement for semiconductor laser devices used in optoelectronic packages.

Another object of the present invention is to provide a new and improved power monitoring arrangement for semiconductor laser devices that can be easily be incorporated into any of the present optoelectronic packages.

Another object of the present invention is to provide a new and improved power monitoring arrangement for semiconductor laser devices that greatly simplifies manufacturing of optoelectronic packages.

SUMMARY OF THE INVENTION

Briefly, to achieve the desired objects of the instant invention in accordance with a preferred embodiment thereof, a power monitoring arrangement for semiconductor light emitting devices used in optoelectronic packages is disclosed. The arrangement includes a mounting structure having a mounting surface, a light emitting device providing emitted light at a monitoring output and an active output positioned on the mounting surface of the mounting structure, and a monitor photodetector, having a light sensitive region, positioned on the mounting surface of the mounting structure proximate the monitoring output of the light emitting device. A hemisphere of material is formed to include at least the light sensitive region of the monitor photodetector and the monitoring output of the light emitting device. An outer surface of the hemisphere operates as a reflector to reflect light from the monitoring output of the light emitting device to the light sensitive region of the monitor photodetector. Because of the wide band of light reflected by the inner surface of the hemisphere positioning of the monitor photodetector is completely non-critical and, basically, only needs to be within the hemisphere.

The desired objects of the instant invention are further realized in a method of mounting power monitoring apparatus for semiconductor light emitting devices in optoelectronic packages. The method includes the steps of providing a mounting structure having a mounting surface, positioning a light emitting device with an emitted light output and a monitoring output on the mounting surface of the mounting structure, and positioning a monitor photodetector having a light sensitive region on the mounting surface of the mounting structure proximate the monitoring output of the light emitting device. The method further includes the step of forming a hemisphere of material on the mounting surface so as to include at least the light sensitive region of the monitor photodetector and the monitoring output of the light emitting device. An outer surface of the hemisphere operates as a reflector to reflect light from the monitoring output of the light emitting device to the light sensitive region of the monitor photodetector.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
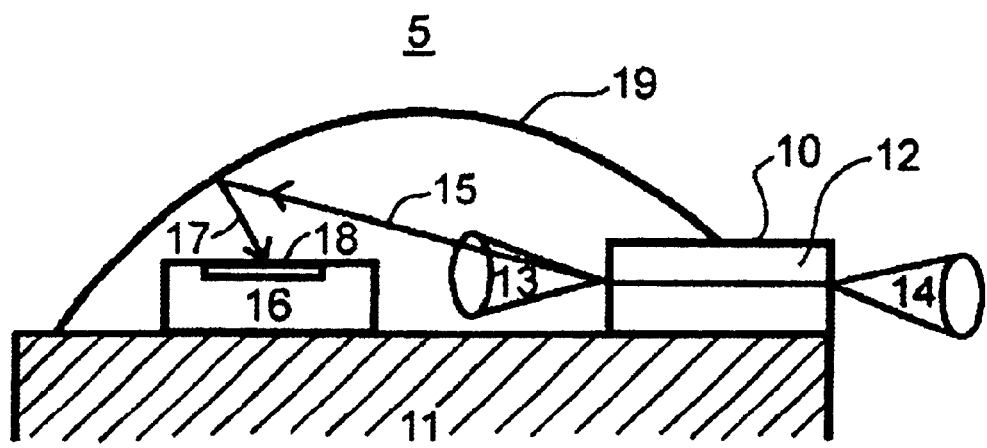
FIG. 1 is a semi-schematic side view of an optoelectronic package in accordance with the present invention.

Turning now to FIG. 1, an optoelectronic package 5 in accordance with the present invention is illustrated. In this embodiment, optoelectronic package 5 includes a supporting structure 11. Supporting structure 11 can be, for example, a semiconductor substrate, a ceramic substrate, a heatsink, or another supporting material with and/or including a desired thermal conductivity. Further, supporting structure 11 can be virtually any desired shape and may be, in some applications, a part of a larger structure, e.g. a ceramic or printed circuit board.

In this embodiment, a light emitting device 10 is positioned on a surface of supporting structure 11. Device 10 can be fixedly attached to supporting structure 11 using adhesive, a solder, or the like. Light emitting device 10 can be, for example, a semiconductor laser device or a similar light emission device wherein it is desirable to monitor the optical power output. In this specific example, light emitting device 10 is an edge emitting semiconductor laser that includes an active region 12 which emits light, represented by cone 13 in one direction and light represented by cone 14 in the opposite direction.

It will be understood by those skilled in the art that most semiconductor light emitting devices emit light in a generally conical shaped beam with different breadths for different types of devices. Also, in this specific example, cone 14 represents the light that is usually coupled into an optoelectronic system and is the light that is of most interest to be monitored. Further, light represented by cone 13 and light represented by cone 14 include similar light that is directly associated so that changes in the power of light represented by cone 14 appear as similar changes to the light represented by cone 13.

In this embodiment, a photodetector 16 is positioned on the surface of supporting structure 11 and proximate to light emitting device 10. Photodetector 16 can be fixedly attached to structure 11 using adhesive, a solder, or the like. Photodetector 16 includes a light sensitive region 18 which is substantially sensitive to the wavelength of light represented by cone 13. Photodetector 16 can be, for example, a PIN photodetector, an avalanche photodetector, or any similar photosensitive device that is capable of detecting light emitted from light emitting device 10.

A hemisphere of an adhesive material 19 is positioned to partially enclose light emitting device 10 and all or substantially all of photodetector 16. Adhesive material 19 can be, for example, silicone and silicon compounds, various epoxies and plastics, liquid glass, or another material with a desired property for adhesion and also a desired property for conducting light represented by cone 13. Preferably, adhesive material 19 is provided in a liquid or semi-liquid state so that a drop of the material can be placed on light emitting device 10 and photodetector 16, as illustrated, and natural adhesion to the surface forms the hemisphere normally or automatically. Further, the difference in indices of refraction between material 19 and the surrounding air, gas, or vacuum (if the package is to be hermetically sealed) produces a mirror effect at the surface that reflects light from light emitting device 10 back into the hemisphere as illustrated by arrow 17.

Figure 2:
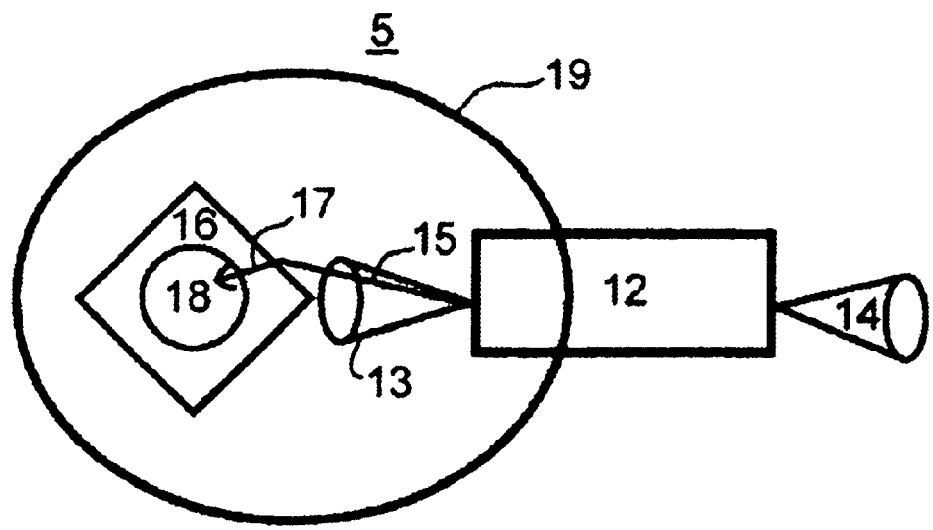
FIG. 2 is a semi-schematic top view of the optoelectronic package of FIG. 1.
Figure 3:
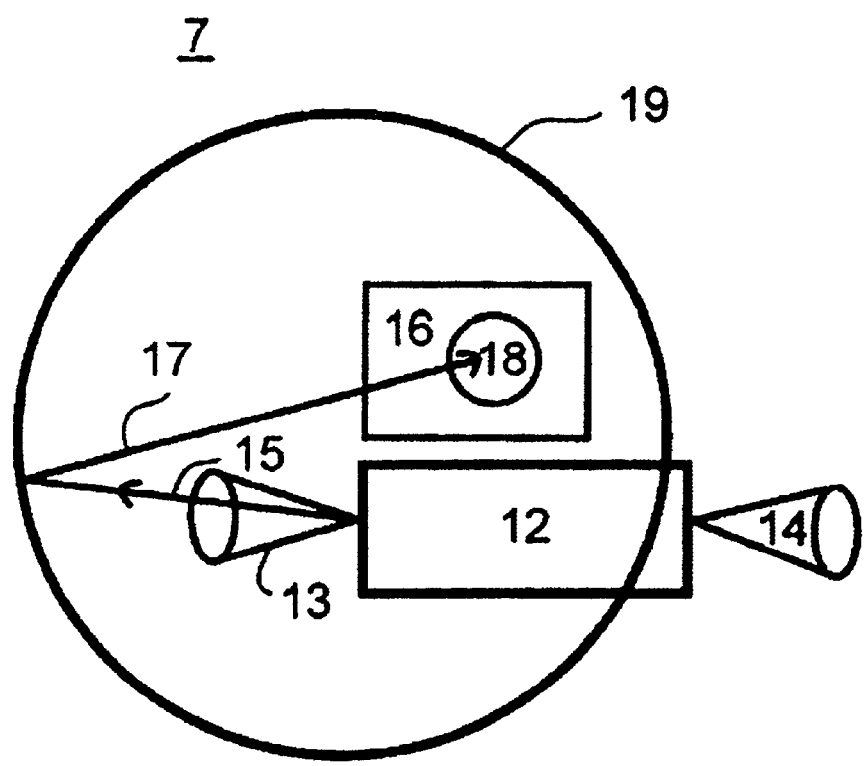
FIG. 3 is a semi-schematic top view of a modification of the optoelectronic package of FIG. 1.

Since light from light emitting device 10 is emitted in a shape generally represented by cone 13, the reflected light (arrow 17) will cover a relatively broad area and the position of photodetector 16 is completely non-critical. As illustrated in FIG. 2 photodetector 16 can be positioned virtually anywhere, within hemisphere of material 19 along a line representing the longitudinal axis of light emitting device 10. Further, as illustrated in FIG. 3, because of the hemispherical shape of material 19, photodetector 16 can be positioned to either side of the path of direct travel of light from light emitting device 10. As illustrated in FIG. 3, light emitting device 10 can be positioned slightly to either side of center and photodetector 16 can be positioned in the opposite side of the hemisphere formed by material 19. Here it will be understood by those skilled in the art that in at least some applications material 19 can be used to adhesively fix either or both light emitting device 10 and photodetector device 16 to the surface of structure 11, thus, further simplifying the manufacturing or assembly process.

Thus, a new and improved power monitoring arrangement for semiconductor laser devices used in optoelectronic packages is disclosed. The improved power monitoring arrangement for semiconductor laser devices can easily be incorporated into any of the present optoelectronic packages and greatly simplifies manufacturing of optoelectronic packages. By substantially reducing the time and work involved in assembling a light emitting device and power monitoring device, the optoelectronic package can be more easily and efficiently assembled, thus, substantially reducing misalignment problems and cost.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A power monitoring arrangement for semiconductor light emitting devices used in optoelectronic packages comprising:
   a mounting structure having a mounting surface;
   a light emitting device providing emitted light at a monitoring output and an active output, the light emitting device being positioned on the mounting surface of the mounting structure;
   a monitor photodetector having a light sensitive region, the monitor photodetector being positioned on the mounting surface of the mounting structure proximate the light emitting device; and
   a hemisphere of material positioned to include at least the light sensitive region of the monitor photodetector and the monitoring output of the light emitting device, an outer surface of the hemisphere operating as a reflector to reflect light from the monitoring output of the light emitting device to the light sensitive region of the monitor photodetector.

2. A power monitoring arrangement for semiconductor light emitting devices used in optoelectronic packages as claimed in claim 1 wherein the light emitting device is an edge emitting semiconductor laser and the monitoring output is the rear emission.

3. A power monitoring arrangement for semiconductor light emitting devices used in optoelectronic packages as claimed in claim 1 wherein the hemisphere of material includes one of silicone and silicon compounds, various epoxies and plastics, and liquid glass.

4. A power monitoring arrangement for semiconductor light emitting devices used in optoelectronic packages as claimed in claim 1 wherein the hemisphere of material fixes the light emitting device and the monitor photodetector to the mounting surface of the mounting structure.

5. A power monitoring arrangement for semiconductor light emitting devices used in optoelectronic packages comprising:
   a mounting structure having a mounting surface;
   an edge emitting semiconductor laser providing emitted light at an active front output and a rear output, the light emitting device being positioned on the mounting surface of the mounting structure;
   a monitor photodetector having a light sensitive region, the monitor photodetector being positioned on the mounting surface of the mounting structure proximate the rear output of the edge emitting semiconductor laser; and
   a hemisphere of material positioned to include at least the light sensitive region of the monitor photodetector and the rear output of the edge emitting semiconductor laser, the hemisphere of material including material that conducts light of a frequency emitted by the edge emitting semiconductor laser, an outer surface of the hemisphere operating as a reflector to reflect light from the rear output of the edge emitting semiconductor laser to the light sensitive region of the monitor photodetector.

6. A power monitoring arrangement for semiconductor light emitting devices used in optoelectronic packages as claimed in claim 5 wherein the hemisphere of material includes one of silicone and silicon compounds, various epoxies and plastics, and liquid glass.

7. A power monitoring arrangement for semiconductor light emitting devices used in optoelectronic packages as claimed in claim 5 wherein the hemisphere of material fixes the light emitting device and the monitor photodetector to the mounting surface of the mounting structure.

8. A method of mounting power monitoring apparatus for semiconductor light emitting devices in optoelectronic packages comprising the steps of:

provide a mounting structure having a mounting surface;

positioning a light emitting device with an emitted light output and a monitoring output on the mounting surface of the mounting structure;

positioning a monitor photodetector having a light sensitive region on the mounting surface of the mounting structure proximate the monitoring output of the light emitting device; and forming a hemisphere of material on the mounting surface so as to include at least the light sensitive region of the monitor photodetector and the monitoring output of the light emitting device, an outer surface of the hemisphere operating as a reflector to reflect light from the monitoring output of the light emitting device to the light sensitive region of the monitor photodetector.

9. A method as claimed in claim 8 wherein the step of forming the hemisphere of material includes delivering a drop of the material such that natural adhesion to the mounting surface forms the hemisphere normally.

10. A method as claimed in claim 9 wherein the step of forming the hemisphere of material includes using a material including one of silicone and silicon compounds, various epoxies and plastics, and liquid glass.

11. A method as claimed in claim 8 wherein the step of positioning a light emitting device includes positioning a semiconductor edge emitting laser with a rear light output positioned within the hemisphere.

\* \* \* \* \*